United States Patent
Laven et al.

(10) Patent No.: US 9,564,495 B2
(45) Date of Patent: Feb. 7, 2017

(54) SEMICONDUCTOR DEVICE WITH A SEMICONDUCTOR BODY CONTAINING HYDROGEN-RELATED DONORS

(71) Applicant: Infineon Technologies AG, Neubiberg (DE)

(72) Inventors: Johannes Georg Laven, Taufkirchen (DE); Hans-Joachim Schulze, Taufkirchen (DE); Moriz Jelinek, Vienna (AT); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/081,487

(22) Filed: Mar. 25, 2016

(65) Prior Publication Data

US 2016/0211336 A1   Jul. 21, 2016

Related U.S. Application Data (62) Division of application No. 14/219,706, filed on Mar. 19, 2014, now Pat. No. 9,312,135.

(51) Int. Cl.
*H01L 31/072* (2012.01)
*H01L 31/109* (2006.01)
(Continued)

(52) U.S. Cl.
CPC .......... *H01L 29/32* (2013.01); *H01L 21/2253* (2013.01); *H01L 21/26506* (2013.01); *H01L 21/26513* (2013.01); *H01L 21/306* (2013.01); *H01L 21/324* (2013.01); *H01L 21/3221* (2013.01); *H01L 21/3242* (2013.01); *H01L 29/04* (2013.01); *H01L 29/16* (2013.01); *H01L 29/167* (2013.01); *H01L 29/36* (2013.01); *H01L 29/7395* (2013.01); *H01L 29/74* (2013.01); *H01L 29/7802* (2013.01); *H01L 29/86* (2013.01)

(58) Field of Classification Search
CPC .......... H01L 21/0257; H01L 21/02529; H01L 21/0415; H01L 21/046; H01L 21/02672; H01L 21/28185; H01L 21/2807; H01L 23/345; H01L 27/228; H01L 29/66045; H01L 29/435; H01L 29/7393; H01L 29/7395
USPC ................. 257/77, 192, 219, 285, 288, 347, 558,257/607, 659, 744, 745, 746, E21.006, E21.043,257/E21.051, E21.054, E21.077, E21.115,257/E21.125, E21.126, E21.127, E21.134,257/E21.135, E21.147, E21.248, E21.319,257/E21.321, E21.32, E21.347
See application file for complete search history.

(56) References Cited

U.S. PATENT DOCUMENTS 5,182,626 A   1/1993   Akiyama et al.
5,444,103 A   8/1995   Tabata et al.
(Continued)

OTHER PUBLICATIONS

Laven, et al., "Activation and Dissociation of Proton-Induced Donor Profiles in Silicon", ECS Journal of Solid State Science and Technology, vol. 2, Issue 9, 2013, pp. 389-394.

*Primary Examiner* — David Nhu
(74) *Attorney, Agent, or Firm* — Murphy, Bilak & Homiller, PLLC (57) ABSTRACT

A semiconductor device includes a semiconductor body with parallel first and second surfaces and containing hydrogen-related donors. A concentration profile of the hydrogen-related donors vertical to the first surface includes a maximum value of at least $1E15$ cm$^{-3}$ at a first distance to the first
(Continued)

surface and does not fall below 1E14 cm$^{-3}$ over at least 60% of an interval between the first surface and the first distance.

7 Claims, 5 Drawing Sheets

(51) Int. Cl.

| | | |
|---|---|---|
| *H01L 31/0328* | (2006.01) | |
| *H01L 31/0336* | (2006.01) | |
| *H01L 29/32* | (2006.01) | |
| *H01L 21/225* | (2006.01) | |
| *H01L 21/265* | (2006.01) | |
| *H01L 21/306* | (2006.01) | |
| *H01L 21/324* | (2006.01) | |
| *H01L 29/04* | (2006.01) | |
| *H01L 29/16* | (2006.01) | |
| *H01L 29/167* | (2006.01) | |
| *H01L 29/36* | (2006.01) | |
| *H01L 21/322* | (2006.01) | |
| *H01L 29/78* | (2006.01) | |
| *H01L 29/86* | (2006.01) | |
| *H01L 29/739* | (2006.01) | |
| *H01L 29/74* | (2006.01) | |

(56) References Cited

U.S. PATENT DOCUMENTS

| | | |
|---|---|---|
| 5,949,125 A | 9/1999 | Meyer |
| 6,285,066 B1 | 9/2001 | Meyer |
| 6,723,586 B1 | 4/2004 | Niedernostheide et al. |
| 7,011,710 B2 | 3/2006 | Bang et al. |
| 7,781,294 B2 | 8/2010 | Mauder et al. |
| 9,312,135 B2 * | 4/2016 | Laven ............... H01L 21/26513 |
| 2016/0172438 A1 * | 6/2016 | Jelinek ............... H01L 29/0634 257/493 |

* cited by examiner

SEMICONDUCTOR DEVICE WITH A SEMICONDUCTOR BODY CONTAINING HYDROGEN-RELATED DONORS

This application is a DIV. of Ser. No. 14/219,706 filed Mar. 19, 2014, U.S. Pat. No. 9,312,135 B2

BACKGROUND

Particle beams irradiated on a single-crystalline semiconductor substrate generate radiation-induced crystal defects. Radiation-induced crystal defects decorated with non-doping impurity atoms such as hydrogen and/or oxygen may be effective as doping centers. For example, annealing a silicon crystal after a proton implant at temperatures between 270 and 470° C. may form stationary and stable hydrogen-related donors. It is desirable to expand the range of possible applications for radiation-induced doping centers and to improve the efficiency of methods for forming doped regions using particle beams containing non-doping atoms.

SUMMARY

According to an embodiment a method of manufacturing a semiconductor device includes inducing generation of auxiliary crystal defects in a semiconductor substrate. Then the semiconductor substrate is pre-annealed at a temperature above a dissociation temperature at which the auxiliary crystal defects transform into defect complexes. Then main implant particles are implanted into the semiconductor substrate, wherein implanting the main implant particles induces the generation of radiation-induced main crystal defects.

According to another embodiment a semiconductor device includes a semiconductor body with parallel first and second surfaces. The semiconductor body contains hydrogen-related donors. A concentration profile of the hydrogen-related donors vertical to the first surface includes a maximum value of at least $1E15$ cm$^{-3}$ at a first distance to the first surface and does not fail below $1E14$ cm$^{-3}$ over at least of an interval between the first surface and the first distance.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

FIGS. 1A to 1D illustrate the formation of particle-related dopants in a semiconductor substrate 500, wherein generation of the particle-related dopants includes inducing generation of main crystal defects by implanting main implant particles 211 in a main implant process.

Figure 1A:
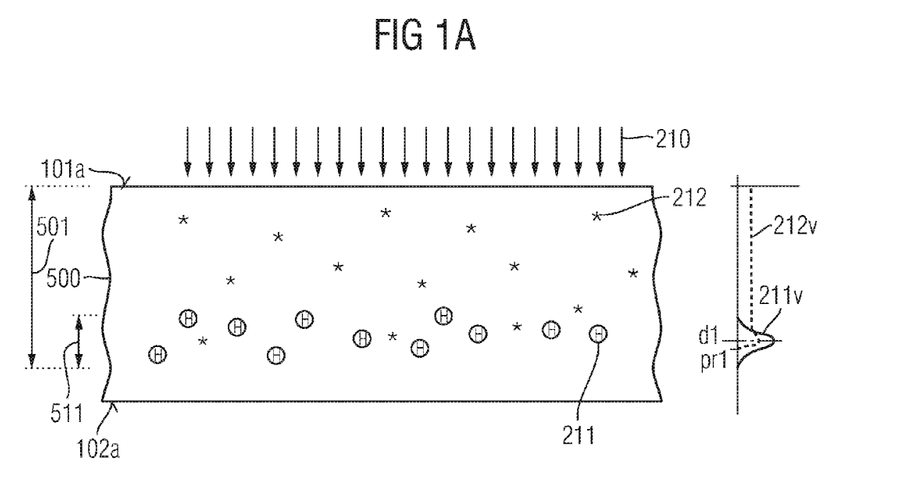
FIG. 1A is a schematic cross-sectional view of a portion of a semiconductor substrate for illustrating a method of manufacturing a semiconductor device according to an embodiment, after implanting auxiliary implant particles.

The semiconductor substrate 500 may be a semiconductor wafer, for example a silicon wafer, an SOI (silicon-on-insulator) wafer, an SOG (silicon-on-glass) wafer or a substrate of another single-crystalline semiconductor material such as silicon carbide SiC, gallium arsenide GaS, gallium nitride GaN or another $A_{III}B_V$ semiconductor, germanium Ge or a silicon germanium crystal SiGe. According to an embodiment the semiconductor substrate 500 is a silicon wafer obtained by a Czochralski process, for example an m:Cz (magnetic Czochralski) silicon wafer with an oxygen content from $1E17$ cm$^{-3}$, for example at least $2E17$ cm$^{-3}$, to $4E17$ cm$^{-3}$.

The semiconductor substrate 500 may have a first surface 101a and a second surface 102a parallel to the first surface 101a. In the following a normal to the first surface 101a defines a vertical direction and directions parallel to the first surface 101a are lateral directions. The semiconductor substrate 500 may include non-doping impurity atoms such as interstitial oxygen atoms.

In the semiconductor substrate 500 the generation of auxiliary crystal defects is induced, e.g., by surface processes generating excess crystal vacancies. For example, the semiconductor substrate 500 may be subjected to a rapid thermal anneal in a nitrogen containing atmosphere at a temperature greater than 1000° C. and at a cooling rate greater than 20° C./min in the temperature range between the maximum temperature and 800° C., and a cooling rate greater than 5° C./min in the temperature range between 800° C. and 500° C.

According to the embodiment illustrated in FIG. 1A, the auxiliary crystal defects are radiation-induced defects induced by an auxiliary implant process. A first implant beam 210 containing auxiliary implant particles 211 such as electrons, neutrons, protons or light ions, for example helium ions, incidents on the first surface 101a. According to an embodiment the implant beam 210 contains protons at an acceleration energy of at least 2 MeV, for example at least 4 MeV and at an implant dose in a range from 5E13 to 1E15 cm$^{-2}$, or 1E14 to 5E14 cm$^{-2}$, e.g., about 4E14 cm$^{-2}$. The auxiliary implant particles 211 traverse a first traversed layer 501 of the semiconductor substrate 500 between the first surface 101a and a first particle range pr1 and induce the formation of the radiation-induced auxiliary crystal defects 212 in the first traversed layer 501.

After the auxiliary implant process, the semiconductor substrate 500 contains the auxiliary crystal defects 212 in the traversed layer 501 as well as the auxiliary implant particles 211 in the first implant layer 511. The vertical concentration profile 212v of the auxiliary crystal defects 212 is approximately constant in a portion of the first traversed layer 501 between the first surface 101a and the first implant layer 511, may have a shallow peak within the first implant layer 511 and may decline from the shallow peak within the second particle range pr1. The vertical concentration profile 211v of the auxiliary implant particles 211 is approximately a Gaussian distribution with the maximum value at a first implant distance d1 determined by the acceleration energy of the auxiliary implant particles 211.

Figure 1B:
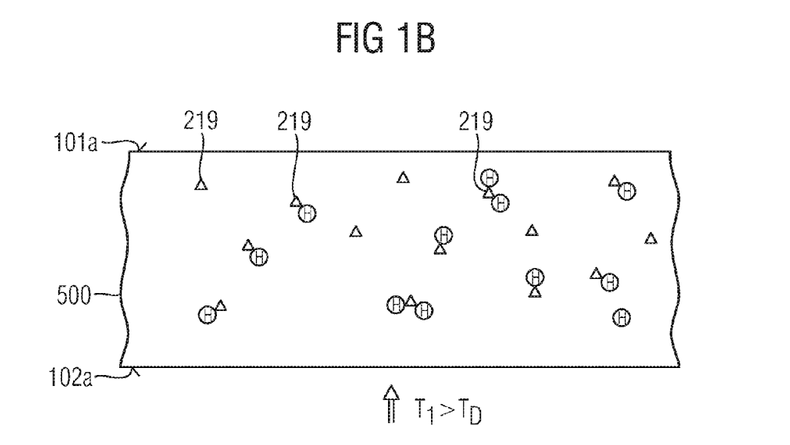
FIG. 1B is a schematic cross-sectional view of the semiconductor substrate portion of FIG. 1A after pre-annealing the semiconductor substrate.

Proceeding to FIG. 1B, the semiconductor substrate 500 is pre-annealed at a first anneal temperature T1 greater than a dissociation temperature TD of the auxiliary crystal defects 212. The auxiliary crystal defects 212 may include core complexes which after dissociation of the auxiliary crystal defects 212 may transform, e.g., agglomerate to high-order crystal defect complexes 219 containing vacancies and oxygen VnOm, thereby optionally incorporating to some degree hydrogen atoms contained in the semiconductor substrate 500. The crystal defect complexes 219 may be electrically inactive, i.e., they are not effective as donors or acceptors. The hydrogen atoms may stabilize the defect complexes. For silicon substrates the first anneal temperature T1 is at least 500° C., for example at least 510° C. or at least 550° C.

The hydrogen atoms may be intrinsic impurities or may be introduced by the previous proton implant. In case the first implant beam 210 does not contain protons, hydrogen atoms may be introduced into the semiconductor substrate, e.g. by in-diffusion from a hydrogen plasma source before, during or after the auxiliary implant process.

FIG. 1B shows crystal defect complexes 219 that may be electrically inactive and that may getter hydrogen atoms present in the semiconductor substrate 500. The crystal defect complexes 219 may provide more getter places than occupied by previously implanted protons. The concentration of free hydrogen atoms is lower than before the pre-anneal and may be lower than before the first implant process. The pre-anneal may convert at least a portion of the auxiliary crystal defects 212 of FIG. 1A or approximately all of them into crystal defect complexes 219. The pre-anneal may last at least one hour or at least three hours, for example at least five hours and increases the efficiency of a following doping process.

Figure 1C:
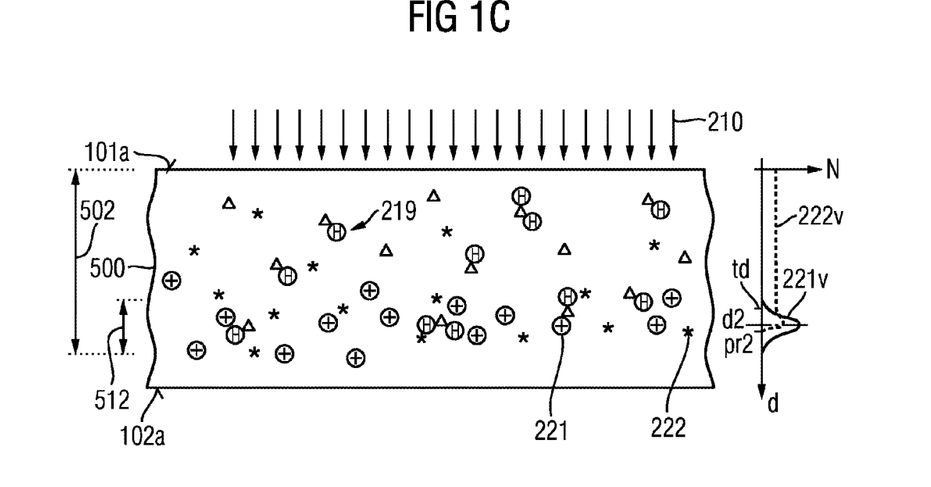
FIG. 1C is a schematic cross-sectional view of the semiconductor substrate portion of FIG. 1B after implanting main implant particles.

In the main implant process illustrated in FIG. 1C, a second implant beam 220 irradiates the first surface 101a of the semiconductor substrate 500. The second implant beam 220 includes main implant protons 221. A second implant distance d2 may correspond to the first implant distance d1 of the first implant beam 210 in FIG. 1A, or may be smaller than the first implant distance d1.

According to other embodiments a vertical impurity concentration profile 221v of the implanted main implant protons 221 has a maximum at a second implant distance d2 which may be greater or smaller than the first implant distance d1 in FIG. 1A. In a second traversed layer 502 traversed by the implanted main implant protons 221 the main implant protons 221 induce the generation of radiation-induced main crystal defects 222. Further implants at different implant energies and/or implant doses may follow.

FIG. 1C shows the main implant protons 221 concentrated in a second implant layer 512, the radiation-induced main crystal defects 222 in a second traversed layer 502 between the first surface 101a and a second particle range pr2 as well as the crystal defect complexes 219 optionally stabilized by hydrogen atoms that may be introduced during the first implant process.

Figure 1D:
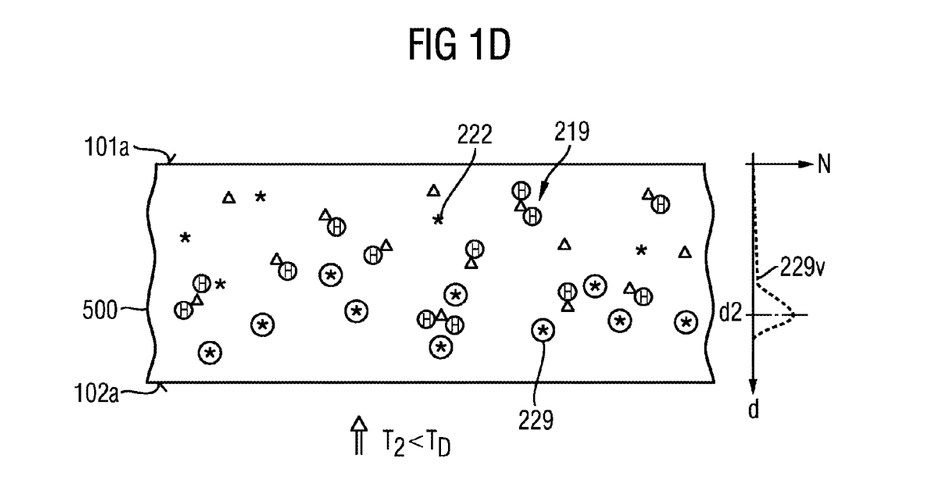
FIG. 1D is a schematic cross-sectional view or the semiconductor substrate portion of FIG. 1C after post-annealing.

A post-anneal at a second anneal temperature T2 below the dissociation temperature T1) forms particle-related dopants 229 localized at the stationary and stable radiation-induced and vacancy-related main crystal defects 222 as shown in FIG. 1D.

The particle-related dopants 229 may be hydrogen-related donors of various species, e.g. hydrogen-related double donors (HDDs), shallow hydrogen-related donors (SHDs), or the like. For silicon substrates the second anneal temperature is between 300° C. and 510° C., for example between 400° C. and 500° C. According to an embodiment the second anneal temperature is between 470° C., and 495° C. and the anneal lasts at least three, e.g. at least five hours.

The hydrogen-related donors 229 are formed predominantly in a zone around a second implant distance d2, where the concentration of the implanted main implant protons has a maximum. In the second implant layer 512 the concentration of the main implant protons is higher than the concentration of the second radiation-induced vacancy-related main crystal defects 222. The formation of particle-related dopants 229 in the second implant zone 512 is mainly given by the number of radiation-induced vacancy-related main crystal defects 222. In case of a proton implant, more hydrogen atoms are available in the second implant layer 512 than hydrogen atoms can be consumed for the formation of hydrogen-related donors.

A high concentration of surplus free hydrogen in the semiconductor substrate 500 may promote the formation of electrically inactive crystal defect complexes at the expense of the efficiency of formation of the hydrogen-related donors 229 such that the surplus hydrogen countervails the formation of hydrogen-related donors. For example, surplus hydrogen may promote the transformation of hydrogen-related donors into additional electrically inactive defect complexes or may induce another process competing with the formation of hydrogen-related donors.

Instead, the preconditioning including generation of auxiliary crystal defects and tempering them above the dissociation temperature TD generates crystal defect complexes 219 that getter some of the free hydrogen atoms and reduce the surplus hydrogen content or even form additional vacancy-hydrogen-related complexes acting as donors.

Hence the presence of the crystal defect complexes 219 increases the efficiency of the formation of hydrogen-related donors during the post-anneal. As a result, a lower overall implantation dose is sufficient for forming an n-type layer containing non-doping atoms. In addition, higher concentrations of particle-related dopants may be achieved than without the preconditioning.

The defect complexes 219 may also getter free oxygen atoms present in the semiconductor substrate 500. For example, m:Cz silicon wafers (magnetic Czochralski silicon wafer) contain to some degree free interstitial oxygen atoms. During manufacturing of semiconductor devices from the semiconductor substrate 500 the free oxygen atoms may form long chain thermal oxygen-related donors at a certain generation rate. The crystal defect complexes 219 may getter to some degree the interstitial oxygen atoms. The gettering of oxygen atoms at the defect complexes 219 competes with the formation of oxygen-related donors and hence reduces the formation of oxygen-related donors. As a result a higher concentration of interstitial oxygen can be tolerated in a virgin semiconductor substrate, e.g., in an m:Cz silicon wafer. For example, the above-described preconditioning may be applied to silicon substrates with an oxygen concentration of at least $1E16$ cm$^{-3}$, at least $1E17$ cm$^{-3}$ or at least $2E17$ cm$^{-3}$.

After the auxiliary implant and before or after the pre-anneal or the post-anneal the semiconductor substrate 500 may be thinned from the second surface 102 up to an auxiliary plane at a target distance td to the first surface 101 in order to shape the vertical dopant profile of the finalized device. The target distance td may correspond to the first particle range pr1 of FIG. 1A, the second particle range pr2, the first implant distance d1 of FIG. 1A, or the second implant distance d2 or may be smaller than the second implant distance d2 such that the second implant layer 512 is largely or completely removed. According to another embodiment, the target distance td is selected such that a region of high dopant concentration may be formed close to or directly adjoining the final rear side surface obtained by the thinning process.

Figure 2A:
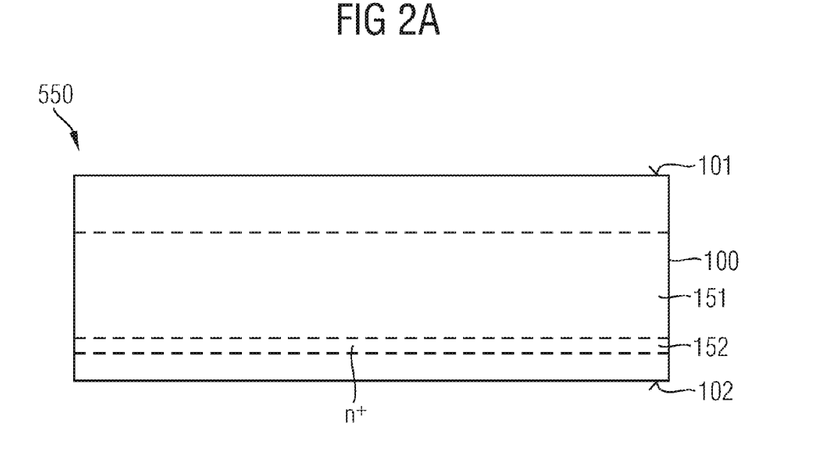
FIG. 2A is a schematic cross-sectional view of a portion of a semiconductor device with an implant layer including particle-related dopants according to a further embodiment.
Figure 2B:
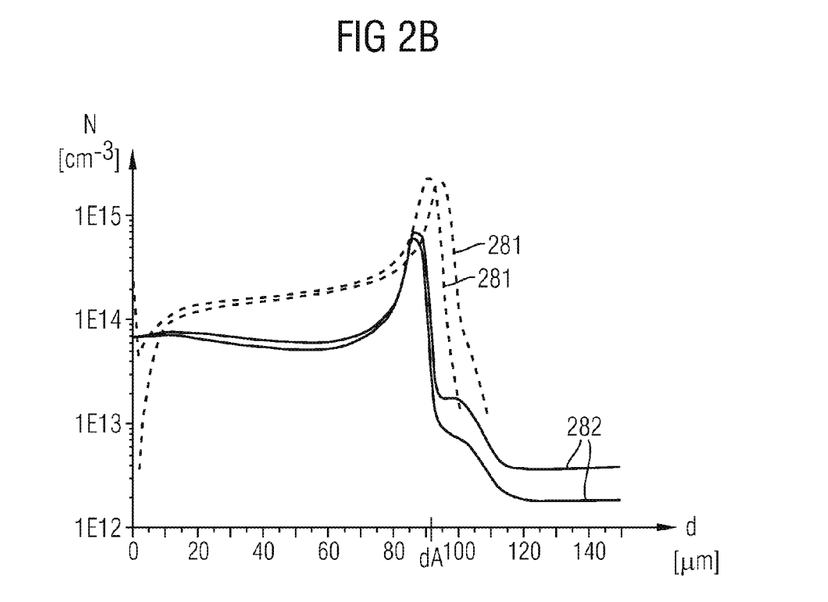
FIG. 2B is a schematic diagram illustrating a vertical concentration profile of the particle-related dopants in the semiconductor device of FIG. 2A.

FIGS. 2A and 211 refer to a semiconductor body 100 of a semiconductor device 550. The semiconductor device 550 may be a semiconductor diode or a semiconductor switching device, for example an IGFET (insulated gate field effect transistor) an IGBT (insulated gate bipolar transistor) or a thyristor. The semiconductor body 100 is based on a single crystalline semiconductor material, for example silicon Si, germanium Ge, silicon germanium SiGe, silicon carbide SiC, gallium arsenide GaS, gallium nitride GaN, another $A_{III}B_{IV}$ compound semiconductor, germanium Ge or a silicon germanium crystal SiGe.

The semiconductor body 100 may have a first surface 101 which may be planar or which may include coplanar surface sections as well as a second surface 102 parallel to the first surface 101. The semiconductor body 100 includes an implant layer 152 containing hydrogen-related donors, wherein an implant dose of a proton implant for generating the hydrogen-related donors is greater than $1E14$ cm$^{-2}$, e.g., greater $4E14$ cm$^-$. Along a vertical direction perpendicular to the first surface 101 the concentration of the hydrogen-related donors steadily decreases between a maximum value within the implant layer 152 and both the first surface 101 and the second surface 102.

According to an embodiment, the maximum value of the concentration profile of the hydrogen-related donors is at least $1E15$ m$^{-3}$, e.g., at least $3E15$ cm$^{-3}$ or $1E16$ m$^{-3}$.

A further implant layer 151 may directly adjoin the implant layer 152, wherein the concentration of hydrogen-related donors in the implant layer 152 is at least four times, e.g. at least ten times, as high as in the further implant layer 151. A vertical extension of the further implant layer 151 may be at least twice as large as the vertical extension of the implant layer 152. In the implant layers 151, 152 the hydrogen-related donors may add to a uniform or stepped background doping of donors such as phosphorus P or arsenic As atoms.

The implant layers 151, 152 may form combinations of a drift zone and a field stop layer, a barrier layer, recombination or injection zones, or portions thereof, by way of example.

FIG. 2B shows first concentration profiles 281 resulting from a process using the above-described preconditioning as well as second concentration profiles 282 for hydrogen-related donors formed according to comparative examples without preconditioning for high implant doses of at least $2E14$ cm$^{-2}$.

Conventionally, after a proton implant, the high hydrogen impurity concentration in and around the implant layer 152 locally countervails the formation of hydrogen-related donors. As a consequence, in a conventional implant layer 152 a maximum value of the concentration of the hydrogen-related donors does not exceed $1E15$ cm$^{-2}$ Further due to the higher hydrogen excess, in and close to the implant layer 152 the formation of the hydrogen-related donors is less effective than at a greater distance to the implant layer 152. Hence, at high implant doses of at least $2E14$ cm$^{-2}$, the second concentration profiles 282 show minima between the implant surface and the concentration maximum. For the embodiment illustrated in FIG. 2B, the minima are in the range of 60 µm to 70 µm, i.e., close to the doping maximum around the end-of-range of the proton implantation. By contrast, since the preconditioning locally decreases the excess of hydrogen such that the countervailing effect of surplus hydrogen is partly accommodated, the first concentration profiles 281 resulting from the above-described preconditioning according to the embodiments show no local minima even at high implant doses of at least $2E14$ cm$^{-2}$ or at least $4E14$ cm$^{-2}$.

Instead, for a maximum value of the hydrogen-related donor concentration of at least $1E15$ cm$^{-3}$, e.g., at least $3E15$ cm$^{-3}$, or, according to a further embodiment, $1E16$ cm$^{-3}$, at a first distance dA to the first surface 101, the hydrogen-related donor concentration does not fall below $1E14$ cm$^{-3}$ over at least 60%, e.g. at least 75%, of an interval between the first surface 101 and the first distance dA, wherein the first distance dA may be greater than 40 µm, for example greater than 60 µm. The first concentration profiles 281 may steadily decrease over at least 60% of the interval between the first surface 101 and the first distance dA with increasing distance to the first distance dA.

According to an embodiment, the first concentration profiles 281 may include one or more further local maxima between the first surface 101 and the first distance dA, wherein the local maxima have values lower than the maximum value at the first distance dA. According to another embodiment the first concentration profiles 281 steadily decrease from the maximum value at the first distance dA with decreasing distance to the first surface 101. In addition the first concentration profiles 281 may steadily decrease from the maximum value at the first distance dA with decreasing distance to the second surface 102.

Figure 3A:
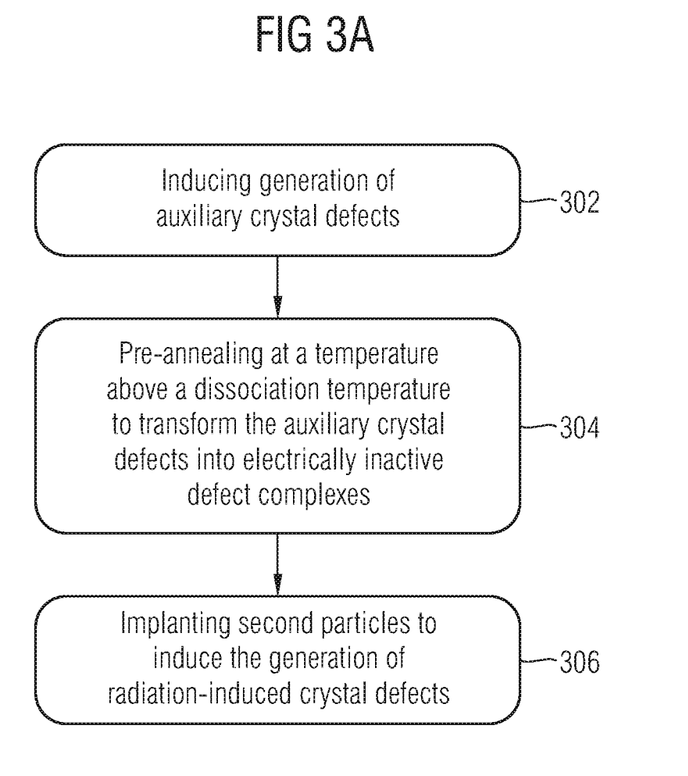
FIG. 3A is a simplified flowchart for illustrating a method of manufacturing a semiconductor device according to a further embodiment.

FIG. 3A refers to a method of manufacturing a semiconductor device. The generation of auxiliary crystal defects is induced in a semiconductor substrate (302). The semiconductor substrate is pre-annealed at a temperature above a dissociation temperature at which the auxiliary crystal defects are transformed into electrically inactive crystal defect complexes (304). Main implant particles are implanted into the semiconductor substrate to induce the generation of radiation-induced main crystal defects (306). A post-anneal may induce the generation of particle-related donors based on the main crystal defects and the pre-annealed auxiliary crystal defects.

Figure 3B:
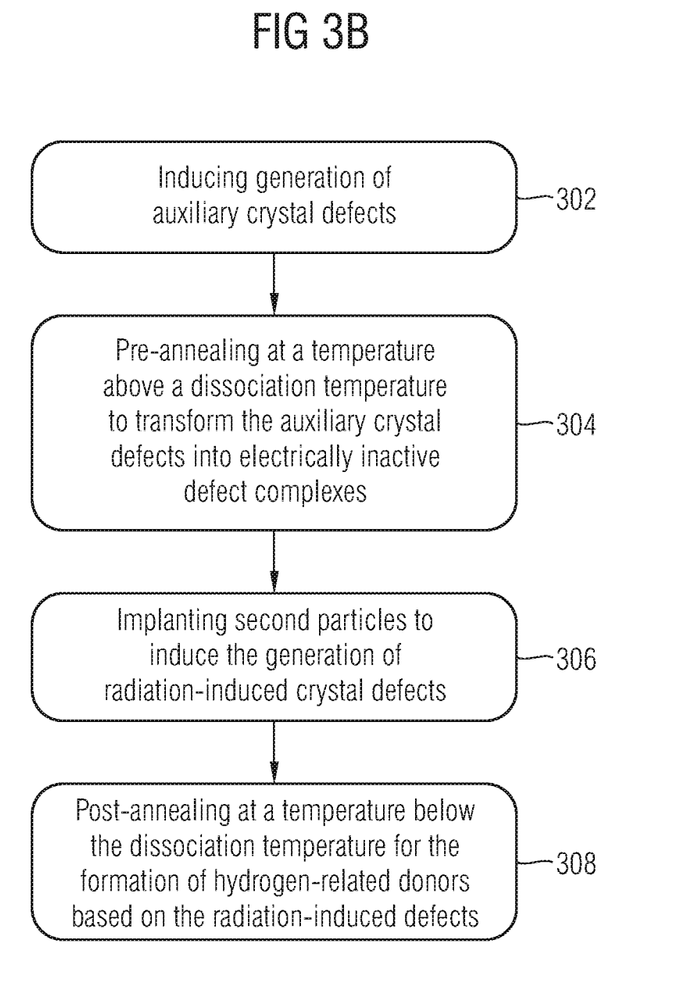
FIG. 3B is a simplified flowchart for illustrating another method of manufacturing a semiconductor device according to a further embodiment including a post-anneal.

The method of FIG. 3B is similar to the method of FIG. 3A and further includes a post-anneal at a temperature below the dissociation temperature for the formation of hydrogen-related donors based on the radiation-induced main crystal defects (308).

Although specific embodiments have been illustrated and described herein, it wall be appreciated by those of ordinary skill in the art that a variety of alternate and/or equivalent implementations may be substituted the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
 a semiconductor body with parallel first and second surfaces and containing hydrogen-related donors, wherein a concentration profile of the hydrogen-related donors vertical to the first surface includes a maximum value of at least $1E15$ $cm^{-3}$ at a first distance to the first surface and does not fall below $1E14$ $cm^{-3}$ over at least 60% of an interval between the first surface and the first distance.

2. The semiconductor device of claim 1, wherein the concentration profile steadily decreases with increasing distance to the first distance over at least 60% of the interval between the first surface and the first distance.

3. The semiconductor device of claim 1, wherein the concentration profile steadily decreases from the first distance to the first surface.

4. The semiconductor device of claim 1, wherein the concentration profile steadily decreases from the first distance to the second surface.

5. The semiconductor device of claim 1, wherein the first distance is greater 50 μm.

6. The semiconductor device of claim 1, wherein the maximum value of the vertical concentration profile of the hydrogen related donors is at least $3E15$ $cm^{-3}$.

7. The semiconductor device of claim 1, wherein the maximum value of the vertical concentration profile of the hydrogen-related donors is at a distance of at most 1 μm to the second surface.

* * * * *

UNITED STATES PATENT AND TRADEMARK OFFICE
CERTIFICATE OF CORRECTION

PATENT NO. : 9,564,495 B2  
APPLICATION NO. : 15/081487  
DATED : February 7, 2017  
INVENTOR(S) : Laven et al.

Page 1 of 1

It is certified that error appears in the above-identified patent and that said Letters Patent is hereby corrected as shown below:

In the Claims

Column 8, Line 21 Claim 6, Line 3 change "hydrogen related" to -- hydrogen-related --

Signed and Sealed this
Eighteenth Day of April, 2017

Michelle K. Lee
*Director of the United States Patent and Trademark Office*